(12) United States Patent
Hirai

(10) Patent No.: US 7,115,898 B2
(45) Date of Patent: Oct. 3, 2006

(54) ORGANIC SEMICONDUCTOR DEVICE, RF MODULATION CIRCUIT, AND IC CARD

(75) Inventor: Tadahiko Hirai, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/512,244

(22) PCT Filed: Apr. 24, 2003

(86) PCT No.: PCT/JP03/05278

§ 371 (c)(1),
(2), (4) Date: Oct. 22, 2004

(87) PCT Pub. No.: WO03/092085

PCT Pub. Date: Nov. 6, 2003

(65) Prior Publication Data

US 2005/0161664 A1 Jul. 28, 2005

(30) Foreign Application Priority Data

Apr. 26, 2002 (JP) ............................ 2002-126164

(51) Int. Cl.
*H01L 29/08* (2006.01)
(52) U.S. Cl. .................. 257/40; 257/197; 257/E51.02; 257/350; 257/E49.001; 257/E51.017; 438/82; 438/99
(58) Field of Classification Search ............ None
See application file for complete search history.

(56) References Cited

U.S. PATENT DOCUMENTS

| 4,939,556 | A | * | 7/1990 | Eguchi et al. ............... 257/25 |
|---|---|---|---|---|
| 5,596,208 | A | | 1/1997 | Dodabalapur et al. ........ 257/66 |
| 5,946,551 | A | | 8/1999 | Dimitrakopoulos et al. .. 438/99 |
| 5,981,970 | A | | 11/1999 | Dimitrakopoulos et al. .. 257/40 |
| 6,210,479 | B1 | | 4/2001 | Bojarczuk ................... 117/84 |
| 6,278,127 | B1 | | 8/2001 | Dodabalapur et al. ........ 257/40 |
| 6,326,640 | B1 | | 12/2001 | Shi et al. ..................... 257/40 |
| 6,344,660 | B1 | | 2/2002 | Dimitrakopoulos et al. .. 257/40 |
| 6,344,662 | B1 | | 2/2002 | Dimitrakopoulos et al. .. 257/40 |
| 6,927,476 | B1 | * | 8/2005 | Freeman et al. ............ 257/586 |
| 2003/0085398 | A1 | * | 5/2003 | Koyama et al. .............. 257/40 |
| 2003/0132693 | A1 | * | 7/2003 | Eden et al. ................ 313/356 |

FOREIGN PATENT DOCUMENTS

| JP | 63-146464 | 6/1988 |
|---|---|---|
| JP | 64-25563 | 1/1989 |
| JP | 07-057871 | 3/1995 |
| JP | 8-228034 | 9/1996 |
| JP | 09-232589 | 9/1997 |
| JP | 10-270712 | 10/1998 |

OTHER PUBLICATIONS

Dimitrakopoulos et al., Low-Voltage Organic . . . Insulators, Science, vol. 283, pp. 822-824 (1999).
Schön et al. , "Self-assembled monolayer organic field-effect transistors", Nature, vol. 413, pp. 713-716, Oct. 2001.

* cited by examiner

*Primary Examiner*—Nathan J. Flynn
*Assistant Examiner*—Scott R. Wilson
(74) *Attorney, Agent, or Firm*—Fitzpatrick, Cella, Harper & Scinto

(57) ABSTRACT

A pair of electrodes are provided to sandwich an organic semiconductor layer. A lead-out electrode is provided to each of the organic semiconductor layer and the two electrodes constituting the pair of electrodes. Consequently, there is provided an organic semiconductor device having a simple configuration.

3 Claims, 5 Drawing Sheets

ORGANIC SEMICONDUCTOR DEVICE, RF MODULATION CIRCUIT, AND IC CARD

TECHNICAL FIELD

The present invention relates to an organic semiconductor device, an RF modulation circuit having the organic semiconductor device, and an IC card having the organic semiconductor device.

BACKGROUND ART

In recent years, there have been widely developed electronic devices using organic semiconductor materials. Reports have been made on development of organic EL (Electro-Luminescence), organic TFT (Thin Film Transistor), organic semiconductor laser, etc. as light emitting devices. Out of these, particular attention is paid to the organic TFT, a type of organic transistors, as a technology for forming integrated circuits on glass or plastic substrates at low cost.

With respect to the structure of the organic TFT, Japanese Patent Laid-Open Nos. 08-228034, 09-232589, 10-270712, etc. propose the devices having the source/drain electrodes and the gate insulating film, and the gate electrode.

It has been pointed out that the organic semiconductor shows a small mobility compared to Si semiconductors and cannot follow a high frequency. In order to improve this point, attempts are made to enhance the mobility by improving crystallinity of the organic semiconductor (C. Dimitrakopoulos et. al., Science, Vol. 283 (1999), P. 822), excessively shorten the gate length (J. H. Schon et. al., Nature, Vol. 413 (2001), P. 713), and the like.

However, any of these attempts necessitates complicated processes, leaving problems in the low cost strategy.

DISCLOSURE OF THE INVENTION

It is therefore an object of the present invention to provide a simply configured organic semiconductor.

Accordingly, the present invention provides an organic semiconductor device comprising: a pair of electrodes opposite to each other on a substrate and an organic semiconductor layer between the pair of electrodes; a first lead-out electrode connected to a first electrode of the pair of electrodes; a second lead-out electrode connected to a second electrode of the pair of electrodes; and a third lead-out electrode connected to the organic semiconductor layer.

BEST MODE FOR CARRYING OUT THE INVENTION

As an embodiment, the following describes an example of the organic semiconductor device according to the present invention.

The organic semiconductor device according to an embodiment of the present invention provides a lead-out electrode independently to each of a pair of electrodes and an organic semiconductor layer therebetween.

Figure 1:
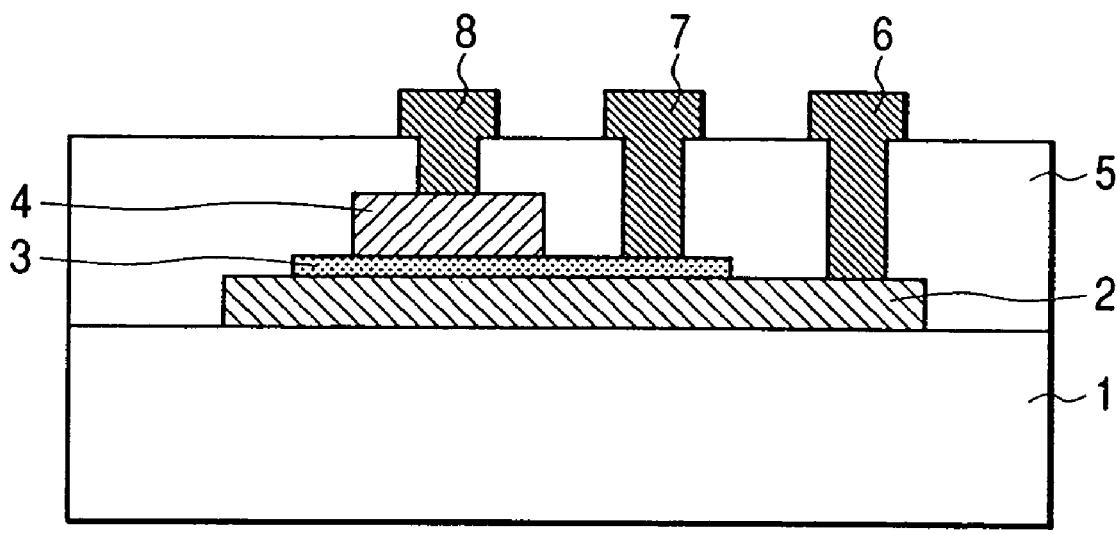
FIG. 1 is a sectional schematic diagram showing a layer configuration of an organic semiconductor device according to an embodiment of the present invention.

FIG. 1 is a sectional schematic diagram showing a layer configuration of the organic semiconductor device according to the embodiment of the present invention.

The reference numeral 1 represents a substrate, 2 a first electrode, 3 an organic semiconductor layer, 4 a second electrode, 5 a protective layer, 6 a first lead-out electrode, 7 a third lead-out electrode, and 8 a second lead-out electrode.

The first electrode 2 is provided on the substrate 1. The organic semiconductor layer 3 is provided thereon. The second electrode 4 is provided on the organic semiconductor layer 3. That is to say, this is a layered configuration. There are provided a pair of opposite electrodes (the first electrode 2 and the second electrode 4) and the organic semiconductor layer 3 therebetween.

The first, second, and third lead-out electrodes 6, 8, 7 are connected to the first electrode 2, the second electrode 4, and the organic semiconductor layer 3, respectively.

The present embodiment can provide the organic semiconductor device having the very simple configuration.

As shown in FIG. 1, the organic semiconductor device according to the embodiment allows the organic semiconductor layer 3 to be provided on part of the first electrode 2. The organic semiconductor layer is not provided on the other part of the first electrode 2. That is to say, the first electrode 2 is provided so as to protrude from the organic semiconductor layer 3. According to this form, the first lead-out electrode 6 can connect with the first electrode 2 at its excess portion.

As shown in FIG 1, the organic semiconductor device according to the embodiment allows the second electrode 4 to be provided on part of the organic semiconductor layer 3. The second electrode 4 is not provided on the other part of the organic semiconductor layer 3. That is to say, the organic semiconductor layer 3 is provided so as to protrude from the second electrode 4. According to this form, the third lead-out electrode 7 can connect with the organic semiconductor layer 3 at its excess portion.

In the organic semiconductor device according to the embodiment, the second lead-out electrode 8 connects to the second electrode 4. In this manner, the organic semiconductor layer 3 protrudes from the second electrode 4. The first electrode 2 surpasses the organic semiconductor layer 3. The first through third lead-out electrodes 6, 7, and 8 can be aligned along a specified direction.

In the organic semiconductor device according to the embodiment, the protective layer 5 is arranged so as to cover the first electrode 2, the organic semiconductor layer 3, and the second electrode 4. The first through third lead-out electrodes 6, 7, and 8 are arranged so as to be taken out from the same side (the same surface side in this case) of the protective layer 5.

Though not shown, the organic semiconductor device according to the embodiment maintains the following relationship among areas in contact with the respective layers: second electrode area<organic semiconductor layer area<first electrode area. When the organic semiconductor device is viewed from the top of FIG. 1, the organic semiconductor layer 3 is arranged inside the first electrode 2. That is to say, the organic semiconductor layer 3 is entirely surrounded by the excess part of the first electrode 2. Further, the second electrode 4 is arranged inside the organic semiconductor layer 3. That is to say, the second electrode 4 is entirely surrounded by the excess part of the organic semiconductor layer 3. This configuration allows the second electrode 4 to be reliably arranged inside the organic semiconductor layer 3. It is possible to prevent the second electrode 4 from being in direct contact with the first electrode 2.

The organic semiconductor device according to the embodiment may be a junction-type transistor. The third lead-out electrode 7 in contact with the organic semiconductor layer 3 can be a base electrode. One of the first and second lead-out electrodes 6 and 8 can be an emitter electrode and the other lead-out electrode can be a collector electrode. In this case, it is desirable to use the first lead-out electrode 6 connected to the wider first electrode 2 (having a larger area) as the collector electrode. Of course, the collector electrode can be the second lead-out electrode 8 connected to the second electrode 4. It is possible to optimally, easily, and accurately adjust the thickness of the sheetlike organic semiconductor layer 3 through the use of the deposition technology such as the vacuum deposition. Further, it is possible to obtain a satisfactory amplification phenomenon as the junction-type transistor. If a rectangular wave of 500 kHz is input, it is possible to recognize an amplification phenomenon equivalent to several tens to a hundred of gains. Alternatively, it is possible to obtain characteristics based on a satisfactory cutoff frequency, i.e., characteristics capable of maintaining a sufficient gain at a high frequency.

For example, it is possible to assume a cutoff frequency of approximately 600 kHz. The organic semiconductor device according to the embodiment can be provided as a constituent element of the RF modulation circuit.

The organic semiconductor device according to the embodiment may have an organic semiconductor layer 3 composed of organic compound such as pentacene, for example. The organic compound to be used should have satisfactory orientation and may show high crystallinity.

The organic semiconductor device according to the embodiment may provide Fermi levels of the first electrode and the second electrode between the conduction band level and the valence band level.

The organic semiconductor device according to the embodiment may provide different Fermi levels for the first electrode and the second electrode. When a lower Fermi level is assigned to the collector electrode, for example, more emitter current can be generated.

When the organic semiconductor device according to the embodiment uses the organic semiconductor layer with the thickness of 100 nm or less, it is possible to generate more emitter current and increase the gain.

In the organic semiconductor device according to the embodiment, the organic semiconductor layer may have the p-type or n-type conduction characteristic.

When the organic semiconductor device according to the embodiment uses a p-type organic semiconductor layer, the third lead-out electrode can be made of any of metals Pt, Au, Ag, Pd, Ir, Ni, Te, Co, and Se, or an alloy or an oxide containing any of these metals such as ITO (Zn or Sn oxide).

When the organic semiconductor device according to the embodiment uses a p-type organic semiconductor layer, the first electrode and the second electrode may use the same or different materials. For example, available materials may be any of metals Ba, Ca, La, Li, Na, Sc, Sr, and Y, or an alloy containing any of these metals, for example.

When the organic semiconductor device according to the embodiment uses an n-type organic semiconductor layer, the third lead-out electrode can be made of any of metals Ba, Ca, La, Li, Na, Sc, Sr, and Y, or an alloy containing any of these metals.

When the organic semiconductor device according to the embodiment uses an n-type organic semiconductor layer, the first electrode and the second electrode may use the same or different materials. For example, available materials may be any of metals Pt, Au, Ag, Pd, Ir, Ni, Te, Co, and Se, or an alloy containing any of these metals, for example.

In the organic semiconductor device according to the embodiment, the substrate is made of an insulating material such as a polyimide resin. In the organic semiconductor device according to the embodiment, the substrate material may or may not be flexible.

In the organic semiconductor device according to the embodiment, the protective layer is made of an insulating material such as silicon oxide.

In the organic semiconductor device according to the embodiment, the first electrode and the organic semiconductor layer are directly connected to each other, and the organic semiconductor layer and the second electrode are directly connected to each other. It just needs to substantially make an electric connection between the first electrode and the organic semiconductor layer. It may provide another very thin layer between them. At least one of the first electrode and the organic semiconductor layer may be configured to be a multilayer. The same applies to the relation between the organic semiconductor layer and the second electrode. It just needs to substantially make an electric connection between the organic semiconductor layer and the second electrode. It may provide another very thin layer between them. At least one of the organic semiconductor layer and the second electrode may be configured to be a multilayer.

The organic semiconductor device according to the embodiment is obtained as follows. The first electrode is formed on the substrate (process 1). The organic semiconductor layer is formed on the first electrode (process 2). The second electrode is formed on the organic semiconductor layer (process 3). The protective layer is formed so as to cover them (process 4). The protective layer is etched so that the lead-out electrodes can be connected to the first electrode, the organic semiconductor layer, and the second electrode (process 5). The lead-out electrodes are formed in the etched positions, i.e., contact holes (process 6).

In the organic semiconductor device according to the embodiment, the organic semiconductor layer can be obtained through not only the above-mentioned vacuum deposition, but also printing techniques such as transfer and ink-jet techniques.

In the organic semiconductor device according to the embodiment, the first or second electrode may be obtained through the use of the vacuum deposition technology such as DC sputtering.

In the organic semiconductor device according to the embodiment, the protective layer may be obtained through the use of the vacuum deposition technology such as the plasma CVD.

The organic semiconductor device according to the embodiment may use the dry etching technique that etches only required positions to create trench holes by using a resist.

The organic semiconductor device according to the embodiment may use the metal mask technique to obtain the lead-out electrodes.

EXAMPLES

Example 1

Example 1 of the present invention describes how to manufacture the organic semiconductor device as the transistor device.

FIGS. 2 through 7 are sectional views of the transistor.

Figure 2:
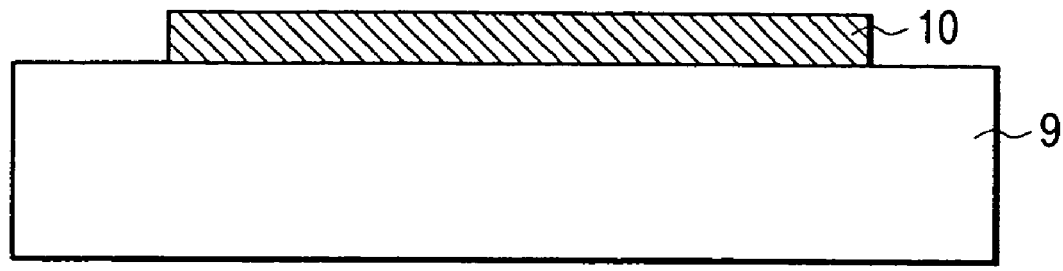
FIG. 2 is a schematic diagram showing a process of manufacturing a transistor device according to example 1 of the present invention.

As shown in FIG. 2, the DC sputtering method is used to form a first conductive layer 10 comprising lanthanum on the surface of an insulating substrate 9 comprising a polyimide resin through a metal mask (not shown).

Figure 3:
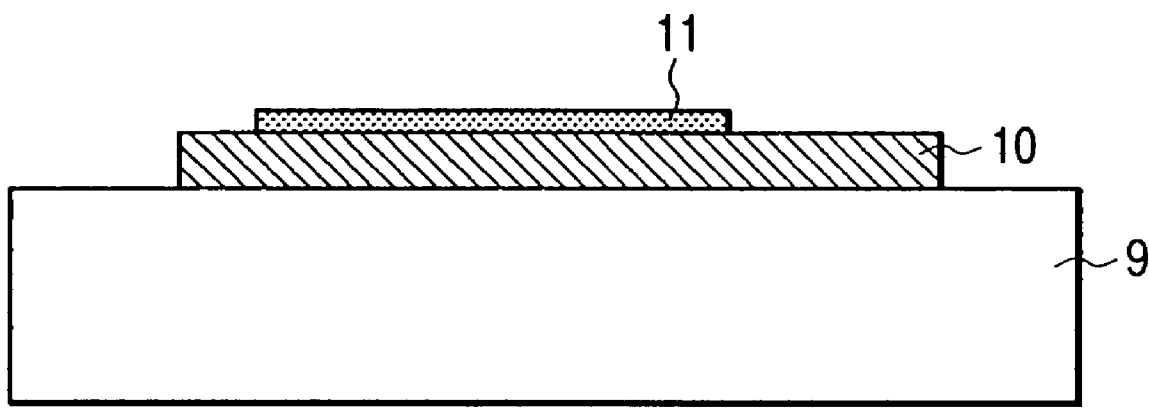
FIG. 3 is a schematic diagram showing a process of manufacturing the transistor device according to example 1 of the present invention.

Then, as shown in FIG. 3, the vacuum deposition is used to form an organic semiconductor layer 11 comprising pentacene through a metal mask (not shown).

Figure 4:
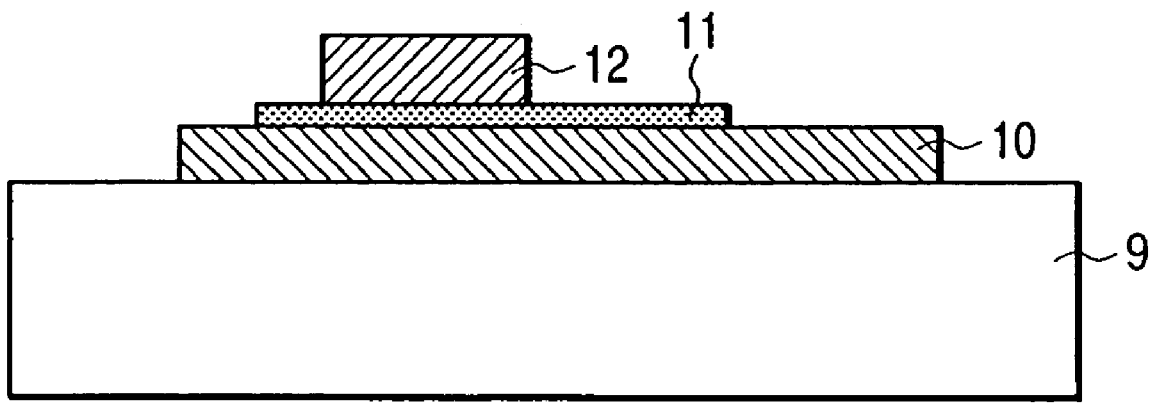
FIG. 4 is a schematic diagram showing a process of manufacturing the transistor device according to example 1 of the present invention.

At this time, the organic semiconductor layer has the thickness of 20 nm. Further, as shown in FIG. 4, the DC sputtering method is used to form a second conductive layer 12 comprising lanthanum. The first and second conductive layers each have the thickness of approximately 200 nm.

Figure 5:
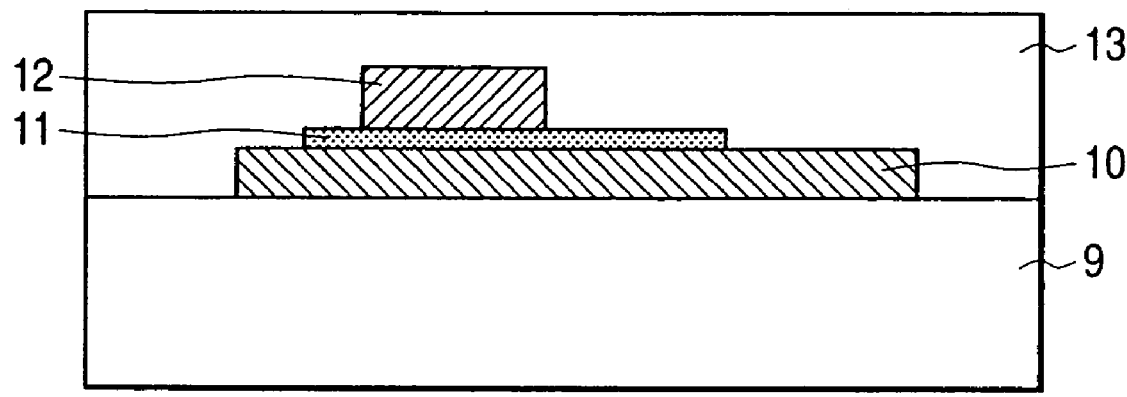
FIG. 5 is a schematic diagram showing a process of manufacturing the transistor device according to example 1 of the present invention.

Then, as shown in FIG. 5, the plasma CVD is used to form a protective insulating layer 13 comprising silicon oxide approximately 500 nm thick. After a resist is applied to the surface thereof, a photolithography process is performed for exposure.

Figure 6:
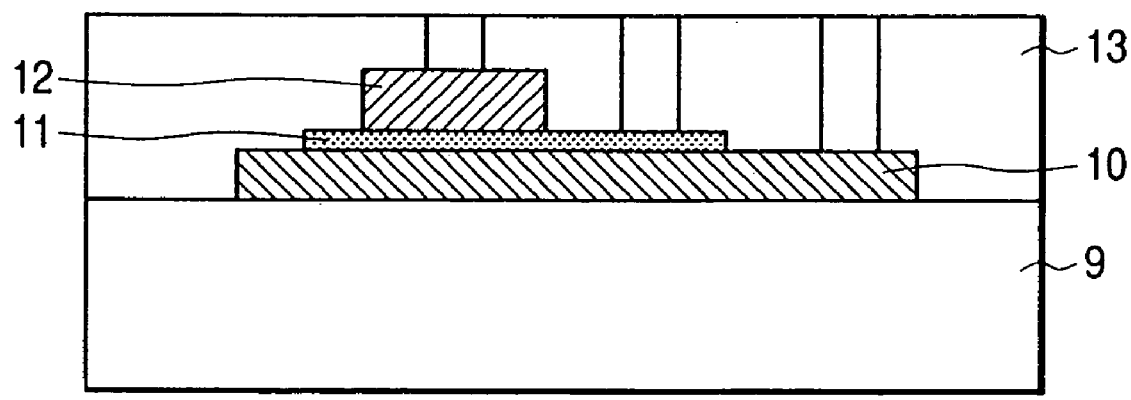
FIG. 6 is a schematic diagram showing a process of manufacturing the transistor device according to example 1 of the present invention.

Then, dry etching is performed by using tetrafluoromethane as an etchant to form contact holes. As a result, the contact holes are created as shown in FIG. 6.

Figure 7:
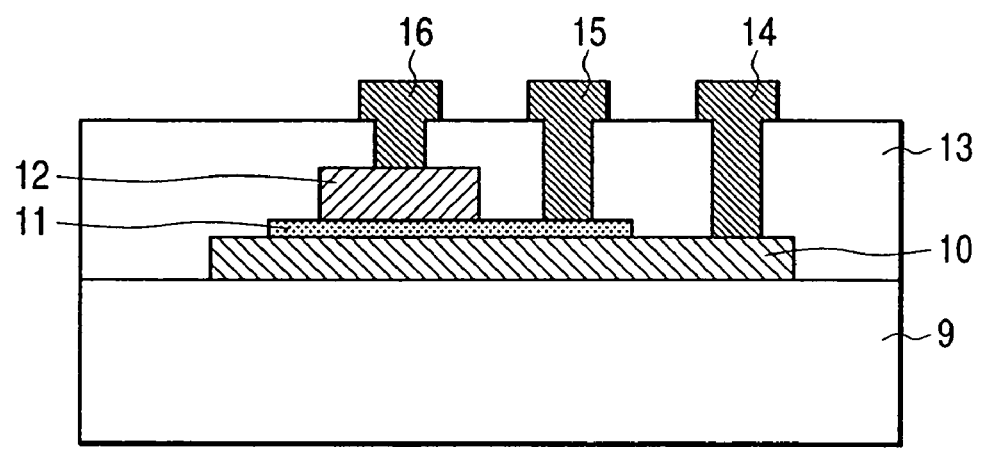
FIG. 7 is a schematic diagram showing the transistor device obtained from processes of manufacturing the transistor device according to example 1 of the present invention.

Then, through a metal mask (not shown), a collector electrode 14 comprising platinum, a base electrode 15, and an emitter electrode 16 are formed to obtain a transistor device as shown in FIG. 7.

Figure 8:
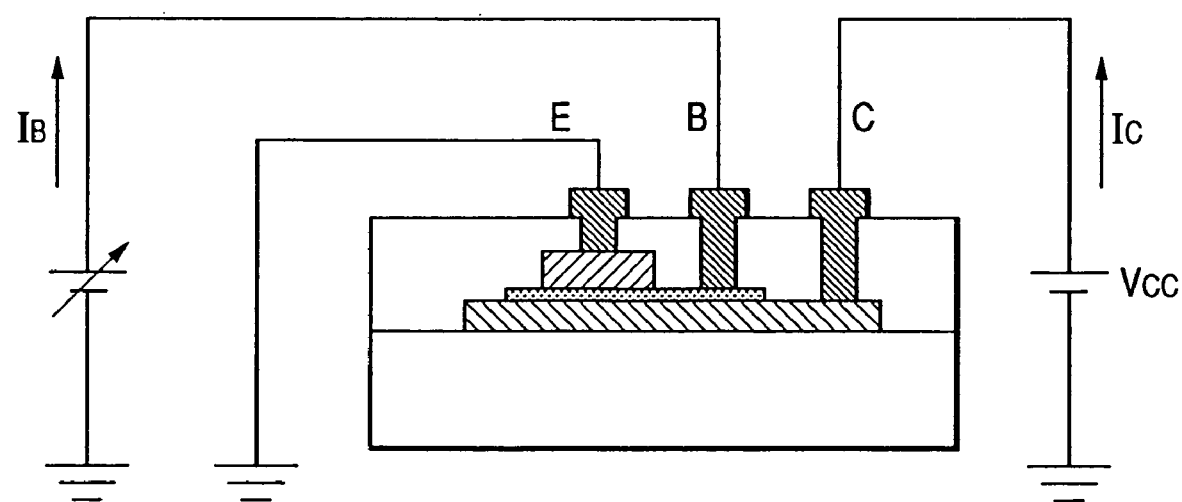
FIG. 8 is a schematic diagram showing power supply connected to the transistor device according to example 1 of the present invention.
Figure 9:
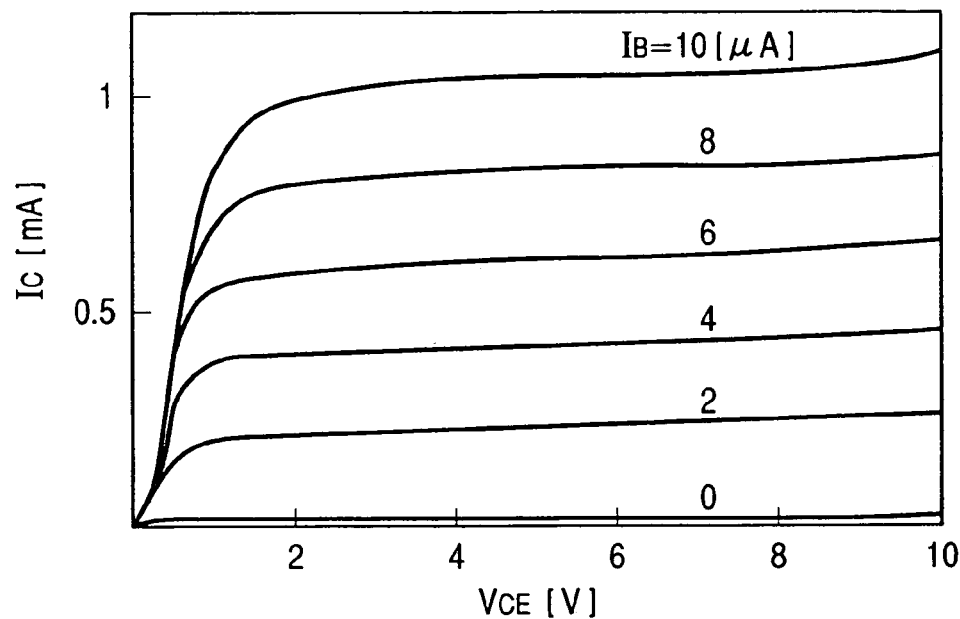
FIG. 9 is a graph showing current/voltage characteristics of the transistor device according to example 1 of the present invention.

A power supply is connected to the transistor device as shown in FIG. 8 to fabricate an emitter ground circuit. The transistor device can provide satisfactory transistor characteristics of approximately a hundred gains as shown in FIG. 9.

In terms of the frequency dependency of the gain, the transistor device is measured for a cutoff frequency at the emitter ground circuit to obtain the frequency of approximately 600 kHz.

When a rectangular wave of 500 kHz is input to the base electrode of the device manufactured by way of trial, a large collector current can be obtained in accordance with the base current, making it possible to observe an amplification phenomenon of the transistor.

Example 2

While the embodiment has described the organic semiconductor device as the transistor device, the example applies the organic semiconductor device to an IC card.

Figure 10:
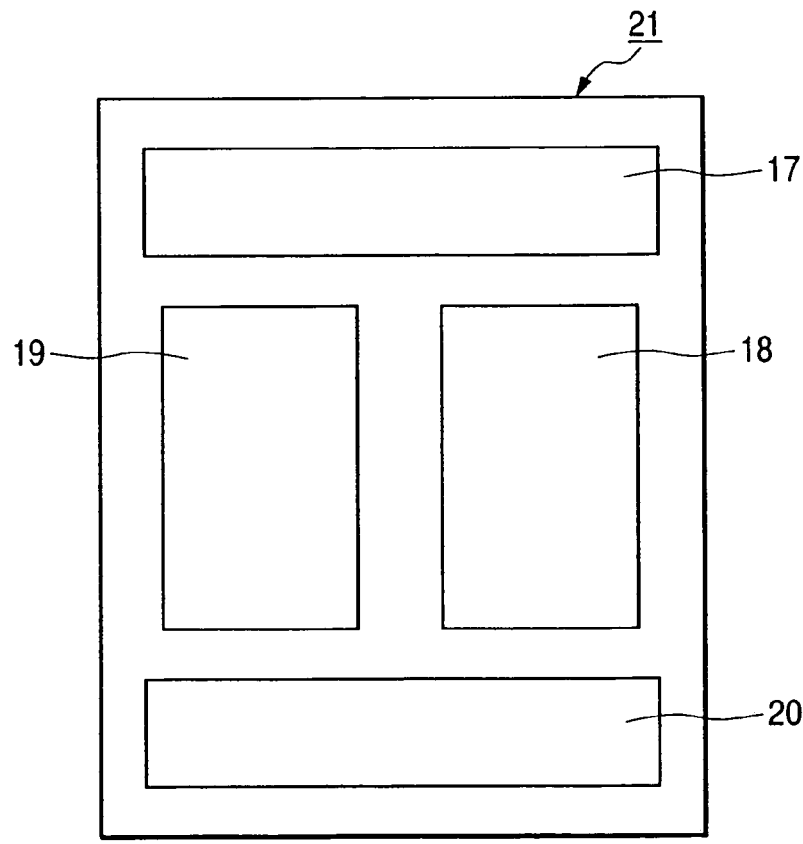
FIG. 10 is a schematic diagram illustrating functional areas on an IC card containing a transistor device according to example 2 of the present invention.

FIG. 10 schematically shows functional areas on the surface of an IC card 21 according to example 2.

The reference numeral 17 represents a magnetic recording area, 18 a ROM array area, 19 a fuse array area, and 20 a data input/output terminal I/O.

When the card is issued, for example, a serial number and the like can be written to the ROM array area 18. This area can be formed by not only on-demand printing, but also the inkjet technology.

The fuse array area 19 can disconnect a fuse for a specified number of uses to intensify the security.

The magnetic recording area 17 is provided to stably maintain the recorded information.

These areas are provided on the entire surface of the IC card. Plural transistor devices according to the embodiment are provided to a switching device, an amplification circuit, a shift register circuit, and the like in each area.

The transistor device according to the embodiment enables all the base, emitter, and collector electrodes to be taken out of the device from one side. For this reason, it is possible to take out all the base, emitter, and collector electrodes as lead-out electrodes from one side within this surface. Accordingly, wiring connections are available on one side of the IC card when the transistor devices are connected to each other or the transistor device is connected to a semiconductor device in another area.

Construction of a non-contact IC card requires a transistor that provides a sufficient gain in the RF band of 1 MHz or more. The organic semiconductor device according to the embodiment can fulfil this with the simple structure.

While there has been described the present invention with reference to the embodiment and the examples, the present invention can provide the simply configured organic semiconductor device.

The invention claimed is:

1. An organic semiconductor device comprising:
   a pair of electrodes opposite to each other on a substrate and an organic semiconductor layer between said pair of electrodes;
   a first lead-out electrode connected to a first electrode of said pair of electrodes;
   a second lead-out electrode connected to a second electrode of said pair of electrodes; and
   a third lead-out electrode connected to said organic semiconductor layer,
   wherein said first electrode, said organic semiconductor layer, and said second electrode are substantially layered on said substrate in the order of said first electrode, said organic semiconductor layer, and said second electrode,
   wherein a surface for providing said organic semiconductor layer of said first electrode comprises a part for providing said organic semiconductor layer and an excess part where said organic semiconductor layer is not provided, and
   wherein said excess part where said organic semiconductor layer is not provided surrounds said part for providing said organic semiconductor layer.

2. An organic semiconductor device comprising:
   a pair of electrodes opposite to each other on a substrate and an organic semiconductor layer between said pair of electrodes;

a first lead-out electrode connected to a first electrode of said pair of electrodes;

a second lead-out electrode connected to a second electrode of said pair of electrodes; and a third lead-out electrode connected to said organic semiconductor layer, wherein said first electrode, said organic semiconductor layer and said second electrode are substantially layered on said substrate in the order of said first electrode, said organic semiconductor layer, and said second electrode, wherein a surface for providing said second electrode of said organic semiconductor layer comprises a part for providing said second electrode and an excess part where said second electrode is not provided, and wherein said excess part where said second electrode is not provided surrounds the part for providing said second electrode.

3. An organic semiconductor device comprising:

a first electrode disposed on a substrate;

an organic semiconductor layer disposed on said first electrode; and a second electrode disposed on said organic semiconductor layer, wherein said first electrode has an excess part where said organic semiconductor layer is not disposed, the excess part of said first electrode surrounding a part underneath said organic semiconductor layer, wherein said organic semiconductor layer has an excess part where said second electrode is not disposed, the excess part of said organic semiconductor layer surrounding a part underneath said second electrode, and wherein a third electrode is disposed on a surface of the excess part of said organic semiconductor layer.

* * * * *